United States Patent

[11] 3,609,404

[72] Inventor Kozo Uchida
Tokyo, Japan
[21] Appl. No. 858,075
[22] Filed Sept. 15, 1969
[45] Patented Sept. 28, 1971
[73] Assignee Iwatsu Electric Company Limited
Tokyo, Japan
[32] Priority Sept. 20, 1968
[33] Japan
[31] 43/67544

[54] WORD PULSE GENERATING DEVICES USING SUCCESSIVE DELAY FOR PULSE FORMATION
5 Claims, 9 Drawing Figs.

[52] U.S. Cl. ........ 307/261, 307/265, 307/269, 307/281, 307/319, 328/55, 328/61, 328/103
[51] Int. Cl. ........ H03k 5/00
[50] Field of Search ........ 307/260, 261, 265, 269, 281, 319; 328/28, 29, 55, 56, 59–61, 103–105, 112, 116, 117, 180; 340/347

[56] References Cited
UNITED STATES PATENTS

| | | | |
|---|---|---|---|
| 2,831,108 | 4/1958 | Barditch | 328/61 X |
| 3,205,376 | 9/1965 | Berry et al. | 307/319 X |
| 3,482,117 | 12/1969 | Wallace, Jr. | 328/61 X |

*Primary Examiner*—Stanley D. Miller, Jr.
*Attorney*—Chittick, Pfund, Birch, Samuels & Gauthier

ABSTRACT: A clock pulse generator for word pulses is comprised of a signal generator, a distributor to divide the signal generated by the signal generator into a plurality of outputs, a plurality of parallel circuits connected to receive the divided signals, each circuit including a serially connected delay circuit and a pulser, and a mixer to combine outputs from the parallel circuits characterized in that the respective parallel circuits have equal delay time difference.

INVENTOR
KOZO UCHIDA
BY
Chittick, Pfund, Birch, Samuels & Gauthier
ATTORNEYS

INVENTOR
KOZO UCHIDA
BY
Chittick, Pfund, Birch, Samuels & Gauthier
ATTORNEYS

INVENTOR
KOZO UCHIDA

BY

Chittick, Pfund, Birch, Samuels & Gauthier
ATTORNEYS

WORD PULSE GENERATING DEVICES USING SUCCESSIVE DELAY FOR PULSE FORMATION

CROSS REFERENCE TO RELATED APPLICATION

This application is related to the U.S. Pat. application of Kozo Uchida, entitled PULSE SHAPING CIRCUIT, Ser. No. 858,042 filed Sept. 15, 1969, filed concurrently herewith.

BACKGROUND OF THE INVENTION

This invention relates to a novel word-pulse-generating device. The term "word pulse" as herein used means a pulse train comprised of $n$ ($n$ bits) pulse groups corresponding to a reference clock pulse and giving a certain meaning i.e. coded by the absence of some pulses in the $n$ bits. Where a pulse is present at a position corresponding to the clock pulse the pulse train represents a binary "1" for that bit whereas a binary "0" is represented when there is no pulse at that position. As a consequence a seven-bit word is represented by a code 1 0 1 1 0 0 1, for example.

Such word pulses are now widely used in data-processing systems such as electronic computers and the like. Since such systems are required to treat a large quantity of data per unit time it is necessary to constitute each word pulse with pulses of high recurrent frequencies. As is well known in the art prior art word pulses generators usually comprised by a logical circuit such as a ring counter, a binary counter, a fixed-frequency dividing circuit or a logical counter operating on the principle of the decision by majority, each of the logical circuits consisting of transistors alone or a combination of transistors and high speed diodes such as tunnel diodes. The operating speed of such prior art word pulse generators was not sufficiently fast owing to the inherent limit of the response speed of transistors so that with the fastest logical circuit the clock frequency of the word pulse was at most about 500 MHz.

SUMMARY OF THE INVENTION

It is an object of this invention to provide an improved word pulse generator operating at higher clock frequencies, 2 GHz., for example.

Another object of this invention is to provide a novel word pulse generator comprising a plurality of parallel circuits each including serially connected delay circuit and a pulser and capable of producing word pulse trains representing binary "0" or "1" for the word bit by selectively interrupting one or more of the parallel circuits.

Briefly stated, in accordance with this invention there are provided a clock pulse generator for word pulses comprising a signal generator, a distributor connected to the signal generator and having a plurality of output terminals, a plurality of parallel circuits connected to respective output terminals of the distributor, each one of said parallel circuits including a delay circuit and a pulser which are connected in series, and a mixer having input terminals connected to receive outputs form respective parallel circuits and a single output terminal, each of said parallel circuits successively having equal delay time difference.

BRIEF DESCRIPTION OF THE DRAWINGS

The invention can be more fully understood from the following detailed description taken in conjunction with the accompanying drawing in which: the FIG. 1 is a block diagram of one example of the word-pulse-generating device embodying this invention.

DESCRIPTION OF THE PREFERRED EMBODIMENTS

The word-pulse-generating device constructed in accordance with this invention comprises a wave generator G for generating a sine wave or a pulse a distributor A for dividing the output from the wave generator A into a plurality of outputs, (for example $n$) delay circuits $D_1$, $D_2$ ... $D_n$ respectively connected to $n$ output terminals of distributor A, pulser $P_1$, $P_2$ ... $P_n$ energized by respective delay circuits, and a mixer to mix together the outputs of respective pulsers to provide an output to an output terminal 0, as diagrammatically shown in FIG. 1. To aid better understanding of the detailed circuit shown in FIG. 2, delay circuits $D_1$, $D_2$ ... $D_n$ are hereinafter generally designated as a delay means D and pulsers $P_1$,$P_2$ ... $P_n$ as a pulser means P.

Figure 1:
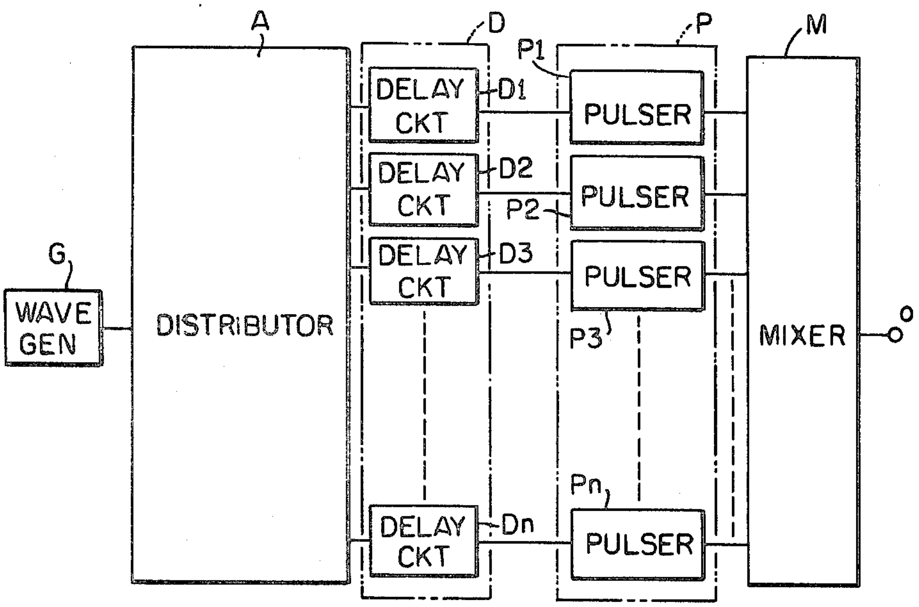

As shown in FIG. 1, between distributor A and mixer M, there are $n$ parallel systems each consisting of a delay circuit and a pulser. As each system is assigned for one bit, the arrangement shown in FIG. 1 functions to generate word pulses of $n$ bit construction. Delay circuits $D_1$, $D_2$ ... $D_n$ have different delay times. However, the difference between delay times of delay circuits $D_1$ and $D_2$, that between delay circuits $D_2$ and $D_3$ and that between delay circuits $D_{n11}$ and $D_n$ are selected to be equal. Each pulser functions to shape into pulses the output from the wave generator which is divided by the divider A and delayed by respective delay circuits. Assuming now that $f_s$ represents the frequency of the output from the wave generator G, and $t_o$ represents the instant at which pulser $P_1$ provides an output, then the output pulse of pulser $P_2$ will be provided at a time of $$t_o+\frac{1}{nf_s}$$

and similarly pulser $P_n$ will provide an output at a time of $$t_o+\frac{n-1}{nfs}$$

whereby the mixer will provide an output pulse train having an interval of 1/nfs, or a pulse train having a clock frequency of $nf_s$. Thus, by selectively interrupting any one or more of the $n$ systems by means of a suitable means it is possible to form the required word pulse.

Figure 2:
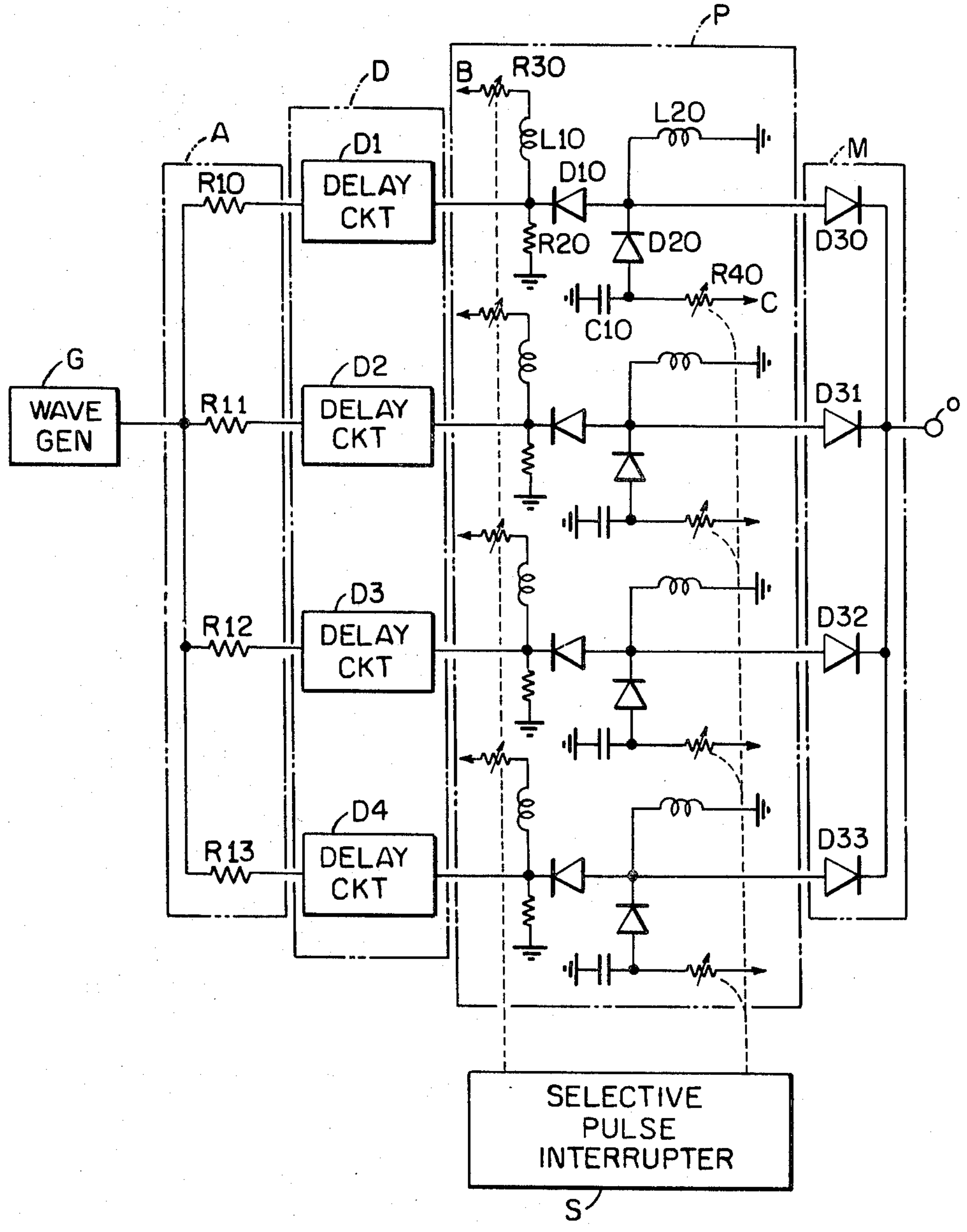
FIG. 2 shows a detailed connection diagram of the word-pulse-generating device.

Let us now consider the detail of the circuit of one embodiment of the novel word pulse generator with reference to FIG. 2 which shows one example of the word pulse generator wherein $n$ =]4 or each word pulse comprises four bits. In other words, the distributor A and the mixer M are interconnected by four parallel circuits. As shown, the distributor A comprises four parallel resistors, $R_{10}$, and $R_{11}$, $R_{12}$ and $R_{13}$ and the delay means D comprises delay circuits or delay cables $D_1$, $D_2$, $D_3$ and $D_4$ having the specified delay time difference. Four pulsers comprising the pulse means P have the same construction but the detailed of the pulser of the representative system will be described later. The mixer M comprises switching diodes $D_{30}$, $D_{31}$, $D_{32}$ and $D_{33}$.

Figure 3A:
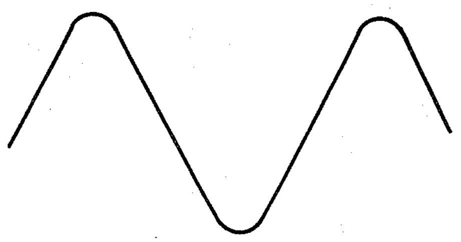
FIG. 3 shows waveforms helpful to explain the operation of the pulser utilized in this invention.
Figures 3B, 3C:
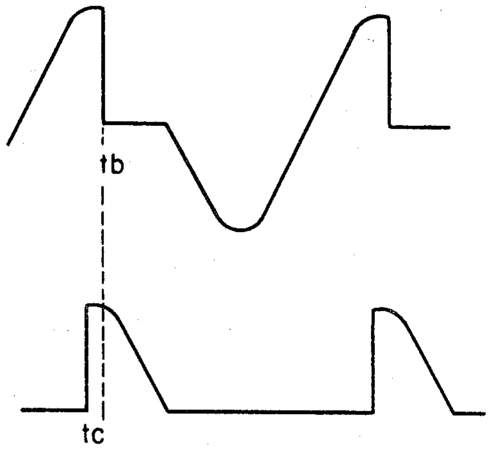

As shown in FIG. 2, the pulser $P_1$ of the first system, for example, takes the form of a pulse-shaping circuit comprising variable resistors $R_{30}$ and $R_{40}$, inductances, $L_{10}$ and $L_{20}$, a condenser $C_{10}$ and snap-off or charge storage diodes $D_{10}$ and $D_{20}$. As the pulse-shaping circuit illustrated herein is described in detail in a copending U.S. Pat. application Ser. No. 858,042 concurrently herewith, it is described herein briefly. More particularly, this pulse-shaping circuit functions to form pulses having steep buildup and cutoff characteristics by the unique utilization of the charge storage time of the snap-off diodes. It is assumed now that the output of the delay cable $D_1$ has a sine waveform as shown in FIG. 3*a*. Reference characters B and C represent sources of supply for the pulse-shaping circuit. In the absence of the snap-off diode $D_{20}$, a waveform as shown in FIG. 3*b* in which the positive portion of the sine wave is eliminated at an instant $t_b$ by said charge-storing phenomenon will appear on the anode electrode side of the snap-off diode $D_{10}$. In this case, the time instant $t_b$ can be varied by adjusting the variable resistor $R_{30}$. On the other hand, where the snap-off diode $D_{20}$ is effective whereas snap-off diode $D_{10}$ is short circuited, a waveform as shown in FIG. 3*c* will appear at the cathode electrode of diode $D_{20}$. This action occurs because when the direction of the current is reversed while diode $D_{20}$ is conducting current in the forward direction, the diode maintains its conductive state for a while (corresponding to the charge storage time) but as the charge storage time elapses diode $D_{20}$ becomes abruptly nonconductive thus generating the waveform as shown in FIG. 3*c* at an instant $t_c$. Again, the instant $t_c$ can be varied by adjusting variable resistor $R_{40}$. Thus, the combination of these two circuits or the pulser circuit shown will provide a pulse of the waveform of a width $t_b'-t_c'$ determined by the time instants $t_b$ and $t_c$, respectively, shown in FIGS. 3*b* and 3*c*. As has already been mentioned variable resistors $R_{30}$ and $R_{40}$ are variable elements that determine time instants $t_b'$ and $t_c'$, respectively, or the width of the pulse. When resistors $R_{30}$ and or $R_{40}$ are adjusted so as to provide a time setting $t_b'<t_c'$, then the pulser will not provide any output pulse. It is to be particularly noted that the condition of the pulser under which no output pulse produced corresponds to a condition under which the system described with reference to FIG. 1 is interrupted to prevent any pulse from being generated at the position of the clock pulse signifying a binary "0" state. In FIG. 2, resistor $R_{20}$ serves to terminate the input signal and inductors $L_{10}$ and $L_{20}$ are designed to have sufficiently high inductances. As has been pointed out before the construction and operation of other pulsers are identical to those of pulser $P_1$.

Pulsers shown in FIG. 2 are set to produce pulses of the same width and as stated before delay circuits $D_1$, $D_2$, $D_3$ and $D_4$ are constructed to provide the same delay time difference. As a consequence, assuming an output signal frequency $f_s$ of generator G of 500 MHz, as the circuit shown in FIG. 2 comprises four parallel systems ($n = 4$), the frequency $f$ of the clock pulse provided at the output terminal 0 will be $f=nf_s=4\times500$ (MHz.) =2,000 MHz. while the pulse interval will be expressed by $$\frac{1}{nf_s}=\frac{1}{4\times500}\ (\text{m}\bar{\bar{\text{H}}}\text{Zz.})\,0.5\ \text{ns.}\,(\text{nanosec.})$$

Figure 4A:
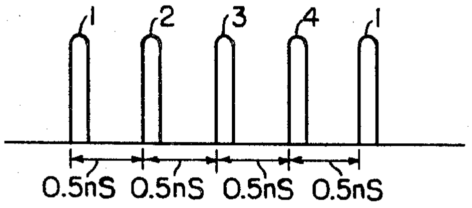
FIG. 4 shows pulse-output waveforms generated by the novel word pulse generator.

Accordingly, when the delay time difference of delay circuits $D_1$, $D_2$, $D_3$ and $D_4$ is set to be equal to 0.5 nsec. and when the variable resistors are adjusted such that the width of the pulse generated by the pulser is sufficiently narrower than 0.5 nsec., then a pulse train as shown in FIG. 4*a* will be produced at the output terminal 0. In FIG. 4*a* pulses 1, 2, 3 and 4 comprise a clock pulse train for one word consisting of four bits, respective pulses representing the pulses produced by the first to fourth systems. Thus, the first pulse 1 represents the pulse produced by the first system and having the frequency of the succeeding stage, or 2,000 MHz.

Figure 4B:
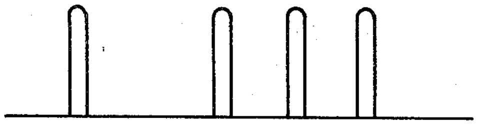

To provide the desired word pulse train, one or more pulses that FIG. the four-bit pulse train are eliminated. Such elimination can be accomplished by selectively interrupting the particular system circuit or circuits assigned for a pulse or pulses to be eliminated. For example, this can be accomplished by setting the pulsers by any suitable means represented by selective pulse interrupter S in FIG. 2 to satisfy the relation $t_c'>t_b'$, as above described. Assuming now that the second system is interrupted, the pulse train appearing at the output terminal will be represented by FIG. 4*b* corresponding to a binary representation of a code "1 0 1 1."

Figure 5:
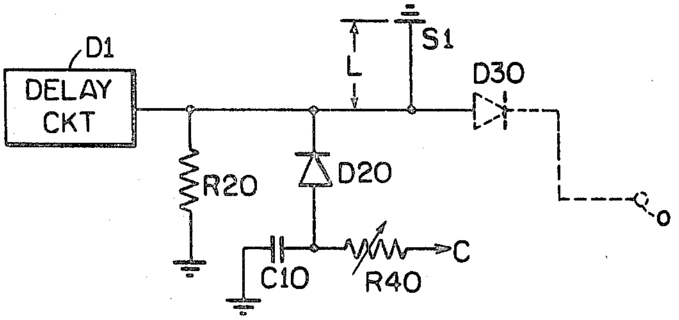
FIG. 5 is a diagram of a modified pulser.
Figure 3D:
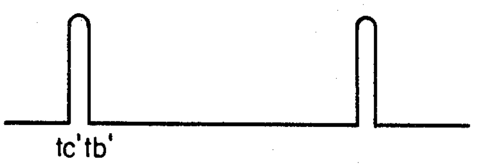

FIG. 5 shows a modified pulser that can be used in this invention. The pulser shown in FIG. 5 comprises a modification of that shown in FIG. 2 wherein the snap-off diode $D_{10}$ is short circuited, variable resistor $R_{30}$, inductances $L_{10}$ and $L_{20}$ are eliminated, and a short-circuiting line $S_1$ of a length 1 is connected to the output side FIG. diode $D_{20}$. Upon impressing a sine wave across diode $D_{20}$, a waveform as shown in FIG. 3*c* will appear at the cathode electrode of diode $D_{20}$ as described hereinabove. When this waveform is applied to the short-circuiting circuit $S_1$ the width thereof will be compressed to a pulse width corresponding to the time required for the pulse to go and return through the length 1, thus producing a pulse of a narrow width as shown in FIG. 3*d*.

Where a plurality (for example *m*) of circuits shown in FIG. 1 and a mixer having *m* input terminals connected to the output terminals of respective circuits and one output terminal are employed, a pulse consisting of *m x n* bits will appear on the output terminal of the mixer. Although in the foregoing embodiments the generator G was explained as generating a sine wave, it should be understood that this invention is not limited to this particular waveform but that a pulse wave or any other continuous oscillation waveform may also be used.

Further, although in order to delay pulses, respective delay circuits $D_1$, $D_2$ ... $D_n$ comprising the delay means D were adjusted, this invention is not limited to this specific means. More particularly, instead of setting respective delay circuits to have equal delay time difference, respective pulsers may be adjusted to generate respective pulses at equal periods. Thus, it is important to set the delay times of respective series circuits such that respective pulses will appear at the same period on the output terminals of a group of series circuits each consisting of a delay circuit and a pulser. Further, although each of the illustrated series circuits comprises delay circuit followed by a pulser, the order or arrangement of these elements may be reversed.

If necessary a suitable amplifier not shown, may be included in the distributor A or to connected to the output terminals of the delay circuits to compensate for the attenuation of the input signal.

As above described, in accordance with this invention, the input signal is distributed to a plurality of (for example *n*) systems, the distributed signals are shaped into the pulses having equal delay time difference by means of a plurality of independent systems each including a delay circuit and thereafter the produced pulses are combined so that the recurrent frequency of the pulse train produced is *n* times as large as the frequency of the input frequency generator. Accordingly, by selecting a suitably frequency for the input signal it is possible to produce pulse trains of extremely high clock frequencies (for example 2 GHz.). Further, even in the device for generating pulses of such extremely high frequencies, as the respective systems treat the input signal frequency, or a frequency equal to 1*n* of that of the output signal, such treatment can be effected very simply when compared with the treatment of the clock frequency itself. Further, as the output frequency of the generator G may be only 1/*n* of that of the desired *n* bit clock pulse the output waveform of the generator may be a sine wave. For this reason, it is easy to provide a pulse generator of high frequencies at low cost. Furthermore, since pulsers utilized in this invention take the form of pulse-shaping circuits for the input signal the amplitude of the output of these circuits is determined by the breakdown voltage characteristics of the diodes comprising pulse-shaping circuits thus enabling the system to directly provide large outputs. Thus, it is possible to produce pulse word trains representing various states by selectively interrupting any desired system or systems among a plurality of systems for shaping pulses of high clock frequencies.

While the invention has been shown and described in terms of preferred embodiments thereof, it should be understood that the invention is not limited thereto and that many changes and modifications will occur to those skilled in the art without departing from the scope and spirit of the invention.

What is claimed is:

1. A clock pulse generator for word pulses comprising a signal generator, a distributor connected to said signal generator and having *n* output terminals, *n* being an integer larger than 2, *n* parallel circuits connected to respective output terminals of said distributor, each one of said circuits including serially connected delay circuit and a pulser, and a mixer having input terminals connected to receive outputs from said *n* parallel circuits and a single output terminal, each of said parallel circuit having equal delay time difference.

2. The word-pulse-generating device according to claim 1 wherein said parallel circuits assigned for respective bits are selectively interrupted to provide the desired binary word pulses.

3. The word-pulse-generating device according to claim 1 wherein each said pulser comprises a snap-diode pulse-generating circuit having impedance means controllable to determine the width of the pulse generated by said pulser including zero-width pulses.

4. The word-pulse-generating device according to claim 3 wherein said parallel circuits assigned for respective bits are selectively interrupted to provide the desired binary word pulses.

5. The word-pulse-generating device according to claim 4 and including means for selectively controlling said impedance means in each of said pulsers for interrupting the output thereof to provide the desired binary word pulses.

PO-1050
(5/69)

UNITED STATES PATENT OFFICE
CERTIFICATE OF CORRECTION

Patent No. 3,609,404 Dated September 28, 1971

Inventor(s) Kozo Uchida

It is certified that error appears in the above-identified patent and that said Letters Patent are hereby corrected as shown below:

Column 1, line 27, delete "by" after "comprised".

Column 2, line 23, delete "$D_{n11}$" and substitute -- $D_{n-1}$ --.

Column 2, line 54, delete "detailed" and insert -- detail --.

Column 3, line 21, insert -- is -- before "produced".

Column 3, line 55, delete "FIG." and substitute the word -- comprise --.

Column 4, line 28, delete "to" before the word "connected".

Signed and sealed this 16th day of May 1972.

(SEAL)
Attest:

EDWARD M.FLETCHER,JR.
Attesting Officer

ROBERT GOTTSCHALK
Commissioner of Patents